United States Patent [19]

Ohta et al.

[11] Patent Number: 4,684,968

[45] Date of Patent: Aug. 4, 1987

[54] JFET IMAGER HAVING LIGHT SENSING INVERSION LAYER INDUCED BY INSULATOR CHARGE

[75] Inventors: Yoshinori Ohta, Kamiina; Jun-ichi Nishizawa, No. 6-16, 1-Chome, Komegafukuro, Sendai City, Miyagi Pref., both of Japan

[73] Assignees: Olympus Optical Co., Ltd.; Jun-ichi Nishizawa, both of Japan

[21] Appl. No.: 557,236

[22] Filed: Dec. 2, 1983

[30] Foreign Application Priority Data

Dec. 14, 1982 [JP] Japan .............................. 57-217756

[51] Int. Cl.⁴ ...................... H01L 31/10; H01L 27/14
[52] U.S. Cl. ........................................ 357/30; 357/22; 357/52; 357/54
[58] Field of Search .................... 357/41, 30, 23.6, 22, 357/30 I, 22 B, 54, 52, 30 R, 30 F

[56] References Cited

U.S. PATENT DOCUMENTS

| | | | |
|---|---|---|---|
| 4,143,389 | 3/1979 | Koike et al. | 357/23.6 |
| 4,349,743 | 9/1982 | Ohba et al. | 357/32 |
| 4,377,817 | 3/1983 | Nishizawa et al. | 357/22 B |
| 4,524,391 | 6/1985 | Nishizawa et al. | 357/24 LR |
| 4,525,742 | 6/1985 | Nishizawa et al. | 357/24 LR |

FOREIGN PATENT DOCUMENTS

| | | | |
|---|---|---|---|
| 55-15229 | 2/1980 | Japan | 357/30 |
| WO81/489 | 2/1981 | PCT Int'l Appl. | 357/22 E |

OTHER PUBLICATIONS

Jacobus et al., "Optical Detector for Short-Wavelength Light", *IBM Tech. Discl. Bull.*, vol. 14, No. 9, Feb. 72, p. 2624.
Nishizawa et al., IEEE Transactions on Electron Devices, vol. ED-25, No. 3, Mar. 1985, High-Frequency High-Power Static Induction Transistor.
Nishizawa et al., IEEE Transactions on Electron Devices, vol. ED-22, No. 4, Apr. 1975, Field-Effect Transistor Versus Analog Transistor (Static Induction Transistor).
Bencuya et al., IEEE Transactions on Electron Devices, vol. ED-32, No. 7, Jul. 1985, Static Induction Transistors Optimized for High-Voltage Operation and High Microwave Power Output.
Nishizawa et al., IEEE Journal of Solid-State Circuits, vol. SC-13, No. 5, Oct. 1978, High Speed and High Density Static Induction Transistor Memory.
Nishizawa et al., IEEE Transactions on Electron Devices, vol. ED-36, No. 12, Dec. 1979, Static Induction Transistor Image Sensors.

*Primary Examiner*—William D. Larkins
*Attorney, Agent, or Firm*—Parkhurst & Oliff

[57] ABSTRACT

A solid state imaging element includes a semiconductor body consisting of a substrate of n+ conductivity type forming a drain region and of an epitaxial layer of n⁻ conductivity type. In a surface of the epitaxial layer is a source region of n+ conductivity type and a signal storage gate region of p+ conductivity type. A transparent insulating film is provided on the signal storage gate region and on a portion of the surface of the epitaxial layer adjoining the signal storage gate region. A transparent gate electrode is provided on the insulating layer. Photocarriers generated in a depletion layer under the surface portion of the epitaxial layer by a light, which is incident through the transparent gate electrode and the transparent insulating layer, are stored in an inversion layer formed by a given bias voltage applied to the gate electrode.

4 Claims, 5 Drawing Figures

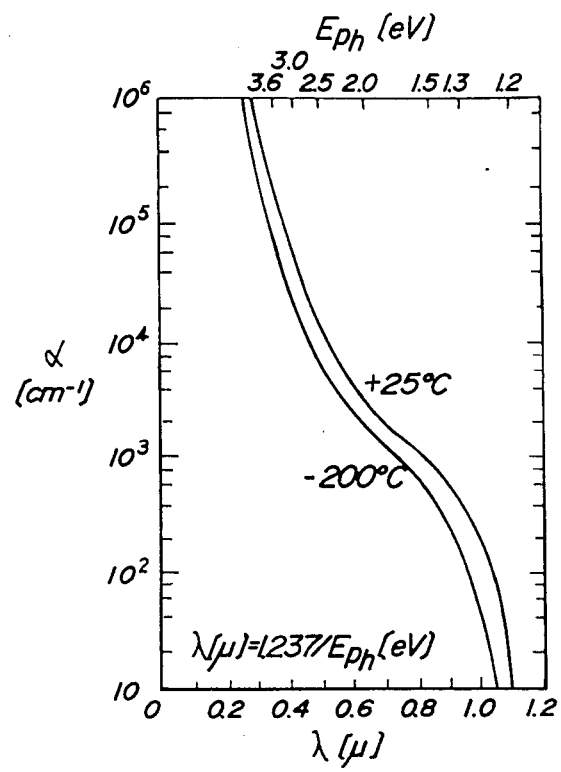
FIG_2
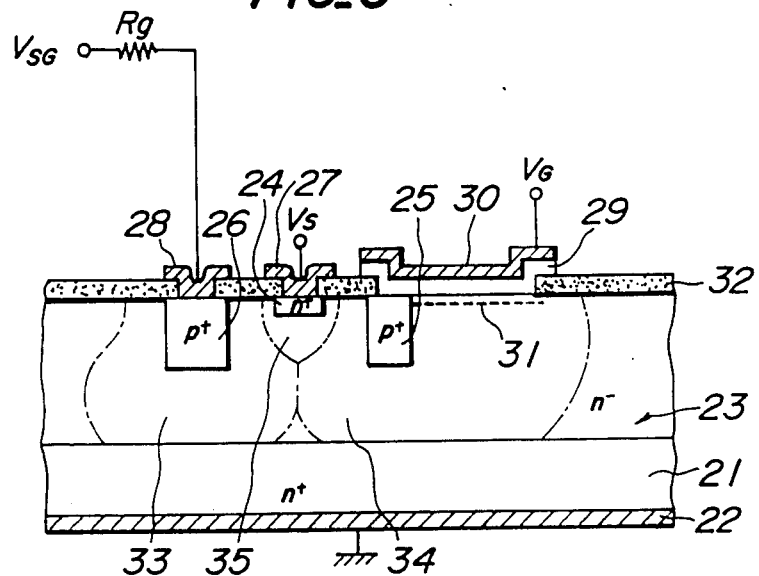
FIG_3

JFET IMAGER HAVING LIGHT SENSING INVERSION LAYER INDUCED BY INSULATOR CHARGE

BACKGROUND OF THE INVENTION

The present invention relates to a solid-state imaging element having a static induction transistor.

In conventional solid-state imaging devices, charge transfer elements such as CCDs (charge coupled devices), or MOS transistors are frequently used. These imaging devices, however, have various problems such as leakage of the charge during the charge transferring operation, a low light detection sensitivity and difficulty in increasing the integration density, and so on. In order to solve these problems, an imaging device having static induction transistors (SITs) have been proposed. For example, in a Japanese Patent Kokai No. 55-15,229, there is described a solid-state imaging device comprising a matrix of SITs, the sources of which are connected to row conductors, the drains to column conductors and the gates to clear conductors. In a further improved solid-state imaging device, capacitors are connected to signal storage gates of SITs and diffused layers are used as isolating gates. FIG. 1A is a perspective view showing a construction of such SIT and FIG. 1B is a circuit diagram showing a whole construction of solid-state imaging device having such SITs.

As shown in FIG. 1A, on a n+-type silicon substrate 1 forming the sources of SITs is grown an n−-type silicon epitaxial layer 2 having an impurity concentration in the range of $10^{13}$–$10^{14}$ atoms/cm$^3$. Hereinafter, the construction of one SIT will be explained. In the surface of said epitaxial layer 2, an n+-type drain region 3, a p+-type signal storage gate region 4 and a p+-type isolating gate region 5 are provided by, for example, a thermal diffusion. The diffusion depth of the drain region 3 is smaller than those of gate regions 4 and 5. The isolating gate region 5, particularly for electrically isolating the neighboring SITs from each other can be floating or connected to a certain potential point. The signal storage gate region 4 is connected to a gate terminal 7 via a capacitor 6, which is formed by, for example, the signal storage gate region 4, an insulating film (not shown) applied thereon and a gate electrode (not shown) provided thereon. The n−-type epitaxial layer 2 forms a channel region, which has been already depleted when the element is in a steady state in which light is not incident, that is, the gate voltage is zero. Therefore, current does not flow between the source and drain regions, even if a forward bias is applied therebetween.

When the light is made incident in such a construction, hole-electron pairs are generated in the channel region or gate depletion layer. The electrons flow to the source 1 connected to earth, while the holes are stored in the signal storage gate region 4 and then charge a capacitor 6 connected to the gate region 4, so that the gate potential is increased by $\Delta V_G$. Representing the capacitance of the capacitor 6 and the charges stored in the signal storage region 4 upon the incidence of light by $C_G$ and $Q_L$, respectively, the following equation can be obtained.

$$\Delta V_G = Q_L/C_G$$

When a gate reading pulse $\phi G$ is supplied to the gate terminal 7 after a certain storage time, the gate potential becomes equal to $\phi G$ plus $\Delta V_G$. Therefore, the potential difference between the signal storage gate region 4 and the drain region 3 is lowered to reduce the depletion layer, so that a drain current corresponding to the incident light flows between the source and drain regions. The drain current is increased by the amplifying operation of SIT in accordance with $\Delta V_G$ multiplied by the amplification factor of the SIT. A similar operation can also be obtained when the source and drain regions of the SIT are interchanged in position.

FIG. 1B shows a circuit diagram of a solid-state imaging device, wherein such SITs are arranged in a matrix form, and FIG. 1C shows signal wave forms for explaining the operation of said imaging device. Each of the SITs 10-1, 10-2, ... is an n-channel SIT of normally off type as described above. Output video signals are read out in accordance with light inputs in an X-Y address system. The common source of SITs, each of which forms a picture cell, is connected to earth and the drains of each row of SITs, which are arranged in an X-direction, are connected to one row line 11-1, 11-2, ... These row lines are connected in common to a video line 13 via row selecting transistors 12-1, 12-2, ..., respectively. The gates of each column of SITs, which are arranged in a Y-direction, are coupled to one column line 14-1, 14-2, ... The video line 13 is connected to the positive terminal of DC supply source 16 via a load resistor 15, the negative terminal of the supply source being connected to the earth.

Now taking a case of reading the output of one SIT picture cell into consideration, if the gate reading pulse $\phi G_1$ is, for example, supplied to the column line 14-1 during the period of time when the transistor 12-1 connected to the first row line 11-1 is switched on by a row selection pulse $\phi S1$, then the SIT 10-1 is selected and the drain current thereof flows through the video line 13 and the load resistor 15, so that an output voltage Vout appears on an output terminal 17. As described before, this drain current is a function of the gate voltage and this gate voltage is a function of the light input, so that the increment $\Delta$Vout from the output voltage at the time of no light input has a voltage corresponding to the magnitude of light input. In this case, the increment $\Delta V_G$ is multiplied by the amplification factor as the result of an amplifying operation of the SIT, so that the increment $\Delta$Vout of the output voltage can be large. Next, a gate reading pulse $\phi G2$ is supplied to a column line 14-2 to effect the reading out of SIT 10-2. After the reading out of the first row of SITs, the transistor 12-2 is switched-on by a row selection pulse $\theta S2$ and then the SITs in next row are sequentially read out.

In the SIT construction described above, however, it is necessary to make the isolating gate region 5 and the signal storage gate region 4 forming a light incident region deeper than the drain region 3 in order to be able to sufficiently open and close the channel. The depth of the drain region is usually about 0.3 μm, while the depth of gate regions is usually a few microns. Therefore, this construction has a disadvantage that the sensitivity of the SIT for the shorter wave length light may be low. That is, it is apparent from FIG. 2 showing wave length dependent characteristics of light absorption coefficient of the silicon (Si) that in the range of the wave length λ of visible light between 0.4 and 0.7 μm, the light absorption coefficient α is equal to about $6 \cdot 10^4$ cm$^{-1}$ at λ=0.4 μm (violet) and is equal to about $2 \cdot 10^3$ cm$^{-1}$ at λ=0.7 μm (red), so that the light absorption coefficient α becomes larger as the wave length λ becomes shorter. Now, when it is assumed that a light intensity at the silicon surface is $I_o$ and a light intensity at a distance of x from the silicon surface is I, the following relation is obtained.

$$I = I_o e^{-\alpha x}$$

From the above equation, the distance x, at which the light intensity is reduced in the silicon by a factor of 10 (i.e. $I/I_o = 1/10$), can be obtained. That is, in the light having a longer wave length of 0.7 μm, the distance x is about 12 μm, while in the light having a shorter wave length of 0.4 μm, the distance x is about 0.38 μm. From this, it is apparent that the light having a shorter wave length is remarkably attenuated near the silicon surface. Therefore, in the SIT construction described above, the intensity of the shorter wave length component of light is considerably reduced, so that the sensitivity of the SIT for the shorter wave length component of light is low.

SUMMARY OF THE INVENTION

It is therefore an object of the invention to provide a solid-state imaging element having a static induction transistor, which can eliminate the disadvantage described above and thereby improve the sensitivity of the SIT for a shorter wave length component of light.

A solid-state imaging element having a static induction transistor according to the invention comprises:

a semiconductor body;

a source region of one conductivity type formed in said semiconductor body;

a drain region of one conductivity type formed in said semiconductor body;

a channel of said one conductivity type formed between said source and drain regions;

a signal storage gate region formed in a surface of the semiconductor body;

a transparent insulating film provided on the surface of the signal storage gate region and on a portion of the surface of the semiconductor body near the signal storage gate region; and a transparent gate electrode provided on at least a portion of said insulating film, which portion is situated on the signal storage gate region;

thereby at a time of storing carriers generated by an incident light an inversion layer being formed in said surface portion of the semiconductor body, so that the carriers generated in a depletion layer portion under said inversion layer are stored in said inversion layer.

BRIEF DESCRIPTION OF THE DRAWINGS

FIG. 2 is a diagram showing wave length dependent characteristics of the light absorption coefficient of silicon; and FIG. 3 is a cross-sectional view showing an embodiment of a solid state imaging element having a static induction transistor according to the invention.

DESCRIPTION OF THE PREFERRED EMBODIMENTS

Figure 1A:
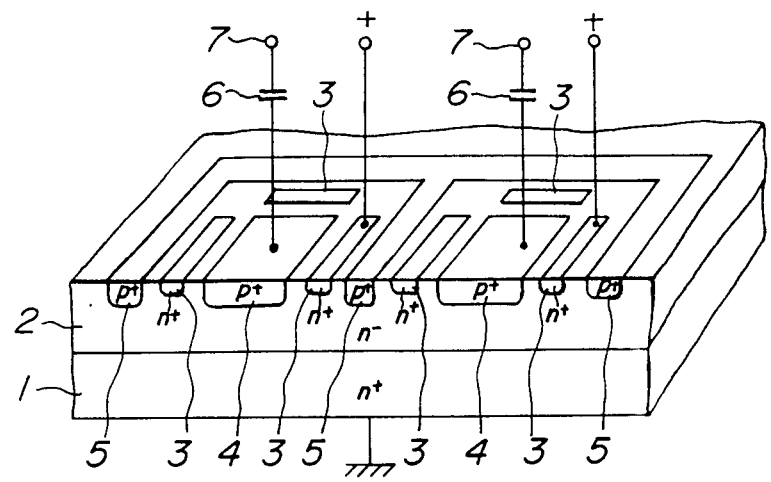
FIG. 1A is a perspective view showing part of imaging elements each having a conventional SIT.
Figure 1B:
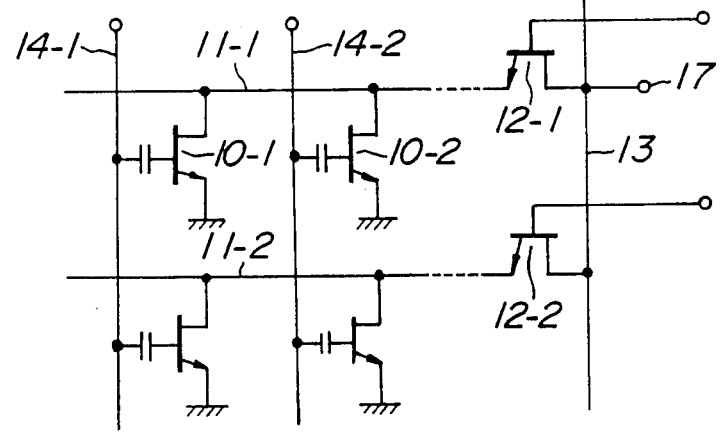
FIG. 1B is a circuit diagram showing a conventional solid-state imaging device consisting of the solid-state imaging elements shown in FIG. 1A.
Figure 1C:
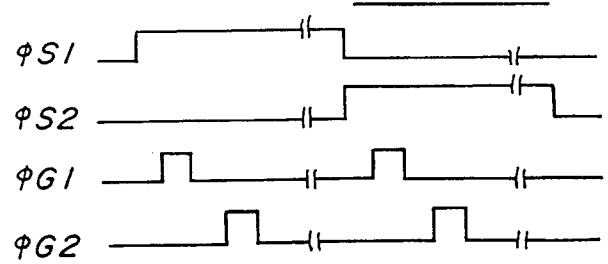
FIG. 1C shows wave forms of signals for use in the imaging device shown in FIG. 1B.

Referring to FIG. 3. there is shown an embodiment of the construction of solid-state imaging element according to the invention. In this embodiment, on one surface an n+-type substrate 21 serving as a drain is applied a drain electrode 22 and on the other surface of the substrate 21 is grown an n⁻-type epitaxial layer 23 having a low impurity concentration between $10^{13}$ and $10^{14}$ atoms/cm³. In the surface of the epitaxial layer 23, an n+-type source region 24 having a depth of about 0.3 μm, a p+-type signal storage gate region 25 having a depth of a few microns and a p+-type isolating gate region 26 having a depth of a few microns are provided by thermal diffusion or ion implantation. Onto the source and isolating gate regions are directly applied electrodes 27 and 28, respectively, and on the signal storage gate region 25 is provided a transparent insulating film 29, on which a transparent gate electrode 30 consisting of, for example, $SnO_2$ or ITO is provided. The transparent insulating film 29 and gate electrode 30 form a gate portion of a MIS (metal insulator semiconductor) construction. In this embodiment, the insulating film 29 extends on the signal storage gate region 25 and also on the portion of the n⁻-type epitaxial layer 23 adjoining the region 25, while the gate electrode 30 on film 29 extends across the entire extent of the insulating film 29. In storing carriers generated by the incident light, to the gate electrode 30 is applied such a bias voltage that an invention layer 31 is formed in the surface of the portion of the n⁻-type epitaxial layer 23 adjoining the signal storage gate region 25, on which portion the insulating film 29 is provided, so that the carriers are stored in the inversion layer 31 in proportion to the amount of incident light. In reading out of a signal, i.e., the amount of incident light, to the gate electrode 30 is applied such a bias voltage that the inversion layer is removed while the charges stored in the surface are maintained. The surface of the n⁻-type epitaxial layer 23, except for the portions thereof having the electrodes 27 and 28 and the insulating film 29, is covered by an $SiO_2$ film 32.

Now, an example of operation of the solid-state imaging device shown in FIG. 3 will be explained.

In this case, the drain electrode 22 is connected to the earth and a voltage $V_{SG}$ is applied to the isolating gate electrode 28 via a resistor $R_g$ having a high resistance to form a depletion layer 33, thereby the neighboring solid-state imaging elements are isolated from each other. In storing the carriers generated by the incident light, to the source electrode 27 is applied a source voltage $V_S$ of zero volts and to the signal storage gate electrode 30 is applied such a negative gate voltage $V_G$ that the inversion layer 31 is formed in the surface of the n⁻-type epitaxial layer 23 under the insulating layer 29. As the result of the formation of the inversion layer 31, a depletion layer 34 extends not only under the signal storage gate region 25 but also under the inversion layer 31. Therefore, the carriers generated in the depletion layer 34 by the incident light are effectively collected in the signal storage gate region 25 and the inversion layer 31. Since the thickness of the inversion layer 31 is about 100 Å and thus very much smaller than that of the signal storage gate region 25, a large amount of carriers can also be generated in the depletion layer 34 by the shorter wave length component of the light which would be easily absorbed by the surface near the portion of the n⁻-type epitaxial layer 23 consisting of silicon. Therefore, the carriers generated by the short wave length component of light are also effectively collected. It is assumed here that the charge amount of holes collected in the signal storage gate region 25 and the inversion layer 31 of electron-hole pairs generated by the incident light is $Q_L$, the capacitance formed by the signal storage gate region 25, the insulating film 29 and the gate electrode 30 is $C_G$, the capacitance of the depletion layer portion formed under the signal storage gate region 25 is $C_j$, the insulating film capacitance formed by the gate electrode 30, the insulating film 29 and the inversion layer 31 is $C_j^i$ and the capacitance of the depletion layer portion formed under the inversion layer 31 is $C_j^i$. The variation $\Delta V_G$ of the gate voltage $V_G$ caused by the storage of the carriers into the signal storage region 25 and the inversion layer can be represented by the following equation.

$$\Delta V_G = \frac{Q_L}{C_G + C_j + C_j^i + C_j^i} \quad (1)$$

In reading out the signal, to the source electrode 27 is applied a negative reading voltage as the source voltage $V_S$ and to the gate electrode 30 is applied such a voltage as the gate voltage $V_G$ that the channel 35 is opened and the carriers stored in the surface portion of the n⁻-type epitaxial layer under the gate electrode 30 are maintained. At this time, the variation of the gate voltage $V_G$ is changed from $\Delta V_G$ to $\Delta V'_G$ expressed by the following equation due to the removal of the depletion layer 34.

$$\Delta V'_G = \frac{Q_L}{C_G + C_j} \quad (2)$$

It is apparent from equations (1) and (2) that at the time of reading out the signal, the gate capacitance does not include the capacitances $C_j^i$ and $C_j^i$. Therefore, at the time of reading out the signal, the variation of the gate voltage, which is equal to $(C_G+C_j+C_j^i+C_j^i)/(C_G+C_j)$ times larger than that of the gate voltage at the time of storing the carriers, can be obtained, so that the apparent light sensitivity can be increased.

As described above, in this embodiment, on the signal storage gate region 25 and on the portion of the n⁻-type epitaxial layer 23 near the gate region 25 is provided an insulating film 29, and on substantially the whole area of the film a gate electrode 30 is provided, so that in storing the carriers, the inversion layer 31 may be formed in the surface portion of the n⁻-type epitaxial layer 23 under the insulating film 29 by a gate bias voltage being applied to the gate electrode 30. Therefore, the carriers generated in the depletion layer 34 under the inversion layer 31 by the shorter wave length component of light may be effectively stored, thereby the sensitivity of the imaging element for the shorter wave length component of light is increased. Moreover, the gate bias voltage applied to the gate electrode 30 at the time of reading out the signal is selected such that the carriers stored in the surface portion of the epitaxial layer 23 under the insulating film 29 can be maintained but the depletion layer 34 can be eliminated, thereby the light sensitivity is increased and thus a higher output is obtained.

While the invention has been described with reference to a particular embodiment, this description is solely for the purpose of illustration and is not to be construed as limiting the scope of the invention claimed below. For example, in the embodiment described above, the inversion layer 31 is formed in the surface portion of the n⁻-type epitaxial layer 23 under the insulating layer 29 by the gate bias voltage applied to the gate electrode 30, but such an inversion layer may be formed in a steady state by keeping negative charges in the insulating film 29 or by holding electrons in electron traps which are situated near boundaries between layers of a multi-layer insulating film formed as the insulating film 29. In this case, it is sufficient to provide the gate electrode 30 only on the insulating film portion corresponding to the signal storage gate region 25. The invention can also be applied to a p-channel structure in an effective manner.

As described above, according to the invention, the gate portion of the SIT forming the light receiving portion consists of a transparent insulating film provided on the surface of the signal storage gate region and on the semiconductor surface portion adjoining the former and of the gate electrode provided on at least a portion of the insulating layer corresponding to the signal storage gate region, so that at the time of storing the carriers generated by the light the inversion layer may be formed in the semiconductor surface portion provided with the insulating layer and situated adjacent to the signal storage gate region, and the carriers generated in the depletion layer portion under the inversion layer may be stored in the inversion layer. Therefore, the carriers generated near the semiconductor surface by the shorter wave length component of light may also be effectively collected, so that the photoelectric conversion efficiency for the shorter wave length component of light can be increased. Further, as in the embodiment described above, if the gate electrode is provided on substantially the whole area of the insulating film applied on the signal storage gate region and on the semiconductor surface portion adjoining the former, so that at the time of storing the carriers the inversion layer may be formed in the semiconductor surface portion adjoining the signal storage gate region by a given bias voltage applied to the gate electrode and at the time of reading out the signal the inversion layer can be removed. But the carriers stored in the semiconductor surface portion may be maintained by a given bias voltage applied to the gate electrode, then the photoelectric conversion efficiency for the shorter wave length of light may be increased, while at the time of reading out the signal the decrease of the gate capacitance increases the variation of the gate voltage due to the carriers generated by the incident light, so that a higher output can be obtained.

What is claimed is:
1. A solid-state imaging element having a static induction transistor comprising:
   a semiconductor body;
   a source region of one conductivity type formed in said semiconductor body;
   a drain region of said one conductivity type formed in said semiconductor body;
   a channel of said one conductivity type formed between said source and drain regions;
   a signal storage gate region formed in a surface of and in rectifying contact with said semiconductor body adjacent said channel region, said signal storage gate region comprising means for regulating current between said source and drain regions by depleting said channel region;

a transparent insulating film having charges therein provided on a surface of said signal storage gate region and on a portion of said surface of said semiconductor body adjacent said signal storage gate region, said charges resulting in a steady stream inversion layer in said portion of said surface of said semiconductor body; and a transparent gate electrode provided on a portion of said surface of said insulating film which is substantially situated on said signal storage gate region, said gate electrode being isolated from said gate region by said insulating film;

wherein at the time of storing carriers generated by an incident light said inversion layer is modified whereby the carriers generated in a depletion layer portion under said inversion layer are stored in said inversion layer, so that the depleting of said channel region is modified by said carriers.

2. A solid-state imaging element having a vertical type static induction transistor as claimed in claim 1, wherein one of said source and drain regions is formed in said surface of said semiconductor body and the other of said source and drain regions is formed in a different surface of said semiconductor body.

3. A solid-state imaging element as claimed in claim 1, wherein at the time of storing said carriers said inversion layer is formed in said surface portion of the semiconductor body by said charges and at the time of reading out a signal said inversion layer is removed while maintaining said carriers in said surface portion of said semiconductor body by a given bias voltage being applied to said gate electrode.

4. A solid-state imaging element as claimed in claim 1, wherein said semiconductor body comprises a substrate of $n^+$ conductivity type forming the drain or source region and of an epitaxial layer of $n^-$ conductivity type provided on said substrate, in a surface of said epitaxial layer being formed said source or drain region of $n^+$ conductivity type and said signal storage gate region of $p^+$ conductivity type.

* * * * *